(12) United States Patent
Gopal et al.

(10) Patent No.: US 10,691,529 B2
(45) Date of Patent: Jun. 23, 2020

(54) SUPPORTING RANDOM ACCESS OF COMPRESSED DATA

(71) Applicant: Intel Corporation, Santa Clara, CA (US)

(72) Inventors: Vinodh Gopal, Westborough, MA (US); James Guilford, Northborough, MA (US); Daniel Cutter, Maynard, MA (US); Kirk Yap, Westborough, MA (US)

(73) Assignee: INTEL CORPORATION, Santa Clara, CA (US)

( * ) Notice: Subject to any disclaimer, the term of this patent is extended or adjusted under 35 U.S.C. 154(b) by 80 days.

(21) Appl. No.: 16/013,710

(22) Filed: Jun. 20, 2018

(65) Prior Publication Data

US 2019/0391869 A1 Dec. 26, 2019

(51) Int. Cl.
*G06F 11/10* (2006.01)
*H03M 7/30* (2006.01)
*H03M 7/40* (2006.01)

(52) U.S. Cl.
CPC ....... *G06F 11/1004* (2013.01); *H03M 7/3086* (2013.01); *H03M 7/40* (2013.01)

(58) Field of Classification Search
CPC .... G06F 11/1004; H03M 7/3086; H03M 7/40
See application file for complete search history.

(56) References Cited

U.S. PATENT DOCUMENTS

| 2009/0031202 | A1* | 1/2009 | Branda | G06F 9/44589 714/807 |
| 2011/0246503 | A1* | 10/2011 | Bender | G06F 9/546 707/769 |
| 2015/0370860 | A1* | 12/2015 | Bender | G06F 9/546 707/609 |
| 2015/0381990 | A1* | 12/2015 | Kwa | G06F 11/1004 375/240.02 |

OTHER PUBLICATIONS

"Deflate", Wikipedia, https://en.wkipedia.org/wiki/DEFLATE, retrieved on Jun. 11, 2018, last edited on Feb. 21, 2018, 7 pages.
Somani, M., et al., "Gzinga: Seekable and Splittable Gzip", https://www.ebayinc.com/stories/blogs/tech/gzinga-seekable-and-splittable-gzip/, retrieved on Jun. 11, 2018, Oct. 9, 2015, 9 pages.

* cited by examiner

*Primary Examiner* — Thien Nguyen
(74) *Attorney, Agent, or Firm* — Nicholson De Vos Webster & Elliott, LLP

(57) ABSTRACT

A processing device comprising compression circuitry to: determine a compression configuration to compress source data; generate a checksum of the source data in an uncompressed state; compress the source data into at least one block based on the compression configuration, wherein the at least one block comprises: a plurality of sub-blocks, wherein the plurality of sub-block includes a predetermined size; a block header corresponding to the plurality of sub-blocks; and decompression circuitry coupled to the compression circuitry, wherein the decompression circuitry to: while not outputting a decompressed data stream of the source data: generate index information corresponding to the (Continued)

plurality of sub-blocks; in response to generating the index information, generate a checksum of the compressed source data associated with the plurality of sub-blocks; and determine whether the checksum of the source data in the uncompressed format matches the checksum of the compressed source data.

23 Claims, 12 Drawing Sheets

400

```
determine a compression configuration to compress source data
                              410
                               │
                               ▼
       generate a checksum of the source data in an uncompressed state
                              420
                               │
                               ▼
  compress the source data into at least one block based on the compression
 configuration, wherein the at least one block comprises: a plurality of sub-blocks,
  wherein the plurality of sub-block includes a predetermined size; a block header
                    corresponding to the plurality of sub-blocks
                              430
                               │
                               ▼
  while not outputting a decompressed data stream of the source data: generate index
             information corresponding to the plurality of sub-blocks
                              440
                               │
                               ▼
   in response to generating the index information, generate a checksum of the
       compressed source data associated with the plurality of sub-blocks
                              450
                               │
                               ▼
 determine whether the checksum of the source data in the uncompressed format
              matches the checksum of the compressed source data
                              460
```

FIG. 4

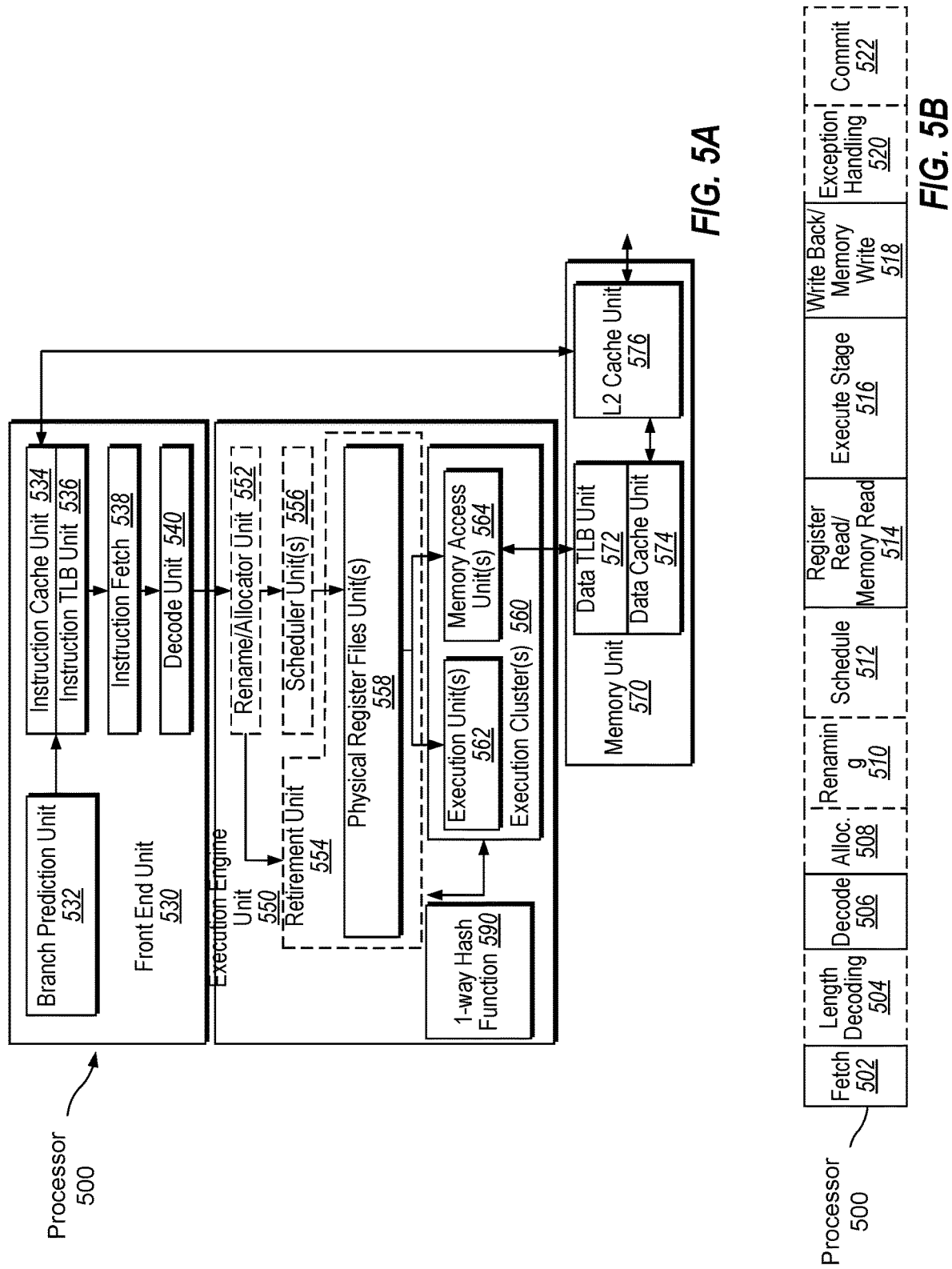

SUPPORTING RANDOM ACCESS OF COMPRESSED DATA

TECHNICAL FIELD

Embodiments of the disclosure relate generally to hardware processors, and more specifically, but without limitation, to supporting random access of compressed data.

BACKGROUND

For "big data" applications, such as within a data center or cloud computing environment, large amounts of data need to be stored reliably and in a cost-effective manner. Compression processes are generally employed to reduce the size of data without sacrificing the information contained within the data. Data consumers are required to decompress the compressed files before using the data. Conventional compression formats for big data stores typically produce relatively poor compression ratios, for example, because they are fairly simplistic in an attempt to provide efficient software implementations, while also allowing for some degree of random access. Compression schemes such as Deflate offer better compression ratios, but current implementations do not allow for random access to compressed data. For example, column-oriented databases are often used in big data environments to provide the desired output. However, compressed column-oriented data requires decompression of a column of data from a start point to a point of interest to access the point of interest. Thus, random accesses on compressed big data stores using conventional techniques are generally cost and resource prohibitive. Moreover, the compressed data, in some instances, may be corrupted during the compressing processes. Accordingly, it is desirable to confirm that the compressed data is not corrupted before being committed.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 illustrates a flow diagram for supporting random access of compressed data according to various embodiments.

FIG. 5A is a block diagram illustrating a micro-architecture for a processor according to an embodiment of the disclosure.

FIG. 5B is a block diagram illustrating an in-order pipeline and a register renaming stage, out-of-order issue/execution pipeline according to an embodiment of the disclosure.

DETAILED DESCRIPTION

Figure 1:
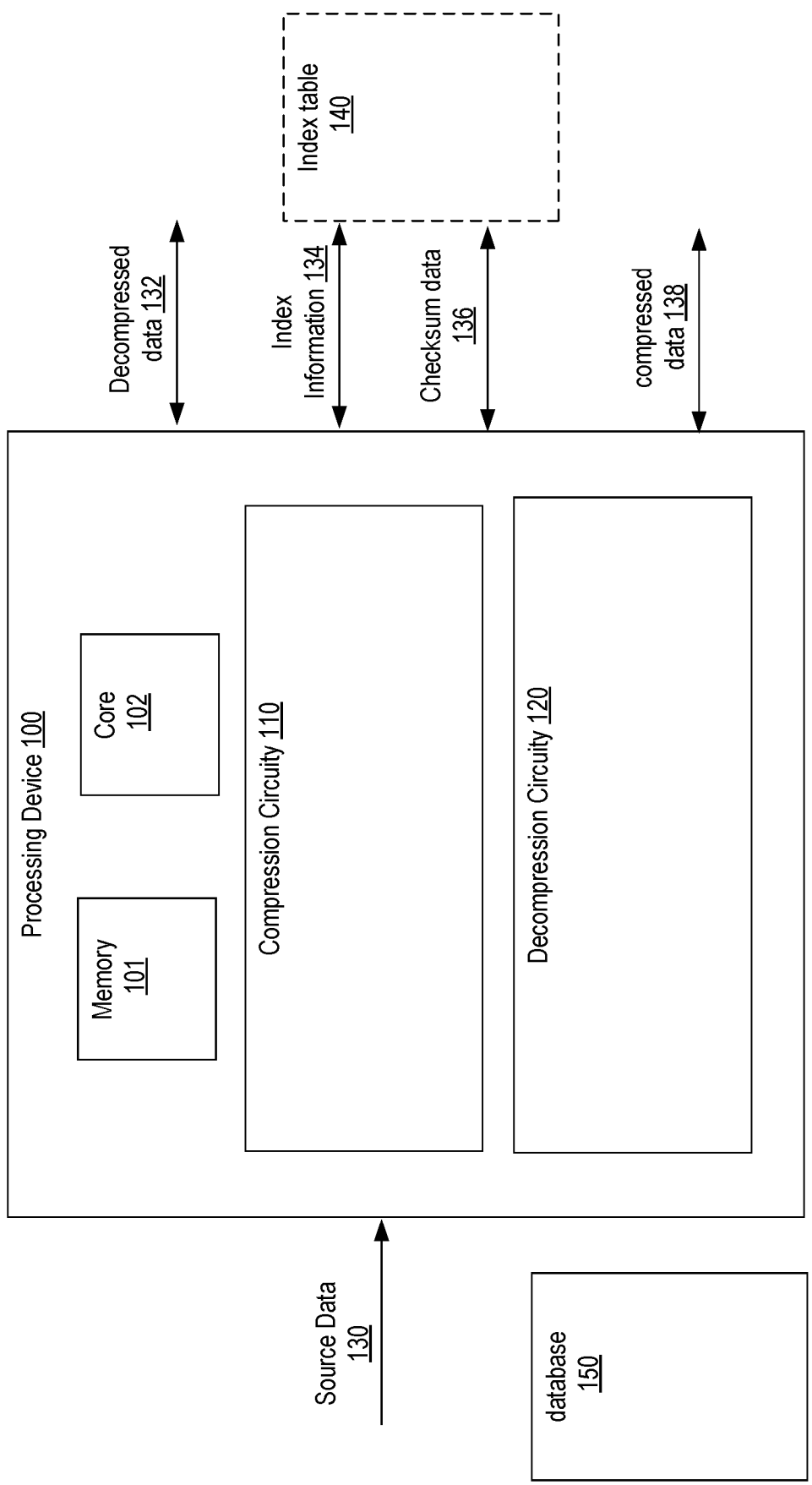
FIG. 1 illustrates a block diagram of a processing device coupled to a database according to various embodiments.

The embodiments described herein are directed to data compression techniques that are capable of providing high compression ratios for compression schemes such as Deflate while also providing random access to compressed data. Additionally, the embodiments described herein permit the compressed data to be verified during compression to make sure it matches the uncompressed source data. For example, the verification, described herein, is provided by checksums which can work in various ways. During compression, the final checksum gives a reasonable assurance that the compressed data can be successfully decompressed (i.e. that the compression was not corrupted). During decompression, the checksum gives a reasonable assurance that the bit stream didn't get corrupted after compression and that the indexing into the compressed stream was correct (i.e. that the data wasn't corrupted in storage, and that the decompress process was performed properly).

Various embodiments may be generally directed to techniques for data compression provided by a computer system. The computer system may include compression circuitry operative to perform a compression process to compress source data to generate compressed data. In some embodiments, the source data may include data from one or more "big data" sources. A non-limiting example of a big data source may include a column-oriented database, for instance, from a column-oriented database management system (DBMS). In some embodiments, the compression process may generate compressed data formed of discrete blocks comprising one or more sub-blocks (or "mini-blocks"). In various embodiments, each sub-block may only include information (for instance, "history" information) that references data within that sub-block. Accordingly, each sub-block may not include history information from other discrete sub-blocks of the compressed data. In various embodiments, each discrete sub-block may be decompressed without requiring decompression of other data elements, for instance, such as other discrete sub-blocks. In various embodiments, the compression process may generate a block index that includes data for individually accessing the discrete sub-blocks. The block index may also include a checksum associated with the data related to the sub-blocks.

Additionally, in some embodiments a decompress-verify process is provided to prevent data loss. A decompress-verify process decompresses compressed data and checks (via a checksum) against the original data before the compressed data can be committed. This ensures no soft-errors (or obscure bugs) in the compression process corrupted the data such that it cannot be decompressed later from storage.

In general, random operations may include any type of operation on specified data of interest ("operation target"), or a portion of the compressed data that includes specified data of interest. For example, a user desires to access uncompressed data at a particular byte (e.g., byte x). In some embodiments, a random operation may include a random access to the compressed data. For example, the compressed data may include a compressed bit stream having discrete sub-blocks $b_0$-$b_{100}$ and the operation target may be located within $b_{50}$. In a conventional system, a decompression process to locate and decompress data of interest would be required, among other things, to decompress the data from a starting data block (for instance, a first Deflate block) to the data block containing the operation target (for instance, a second Deflate block), or to decompress an entire Deflate block in order to access only a portion of the Deflate block. However, a decompression process according to some embodiments may operate to locate and decompress only discrete sub-block $b_{50}$ (which may be one of a plurality of discrete sub-blocks making up a Deflate block) in order to access the operation target. In this manner, compression processes according to some embodiments are able to provide compressed data having high compression ratios.

Various embodiments may be generally directed to techniques for data compression and a decompress-verify process provided by a computer system. In one embodiment, a processing device of a computer system comprising compression circuitry to: determine a compression configuration to compress source data; generate a checksum of the source data in an uncompressed state; compress the source data into at least one block based on the compression configuration, wherein the at least one block comprises: a plurality of sub-blocks, wherein the plurality of sub-block includes a predetermined size; a block header corresponding to the plurality of sub-blocks; and decompression circuitry coupled to the compression circuitry, wherein the decompression circuitry to: while not outputting a decompressed data stream of the source data: generate index information corresponding to the plurality of sub-blocks; in response to generating the index information, generate a checksum of the compressed source data associated with the plurality of sub-blocks; and determine whether the checksum of the source data in the uncompressed format matches the checksum of the compressed source data.

FIG. 1 depicts an operating system that may be representative of various embodiments. The operating system may include processing device 100. Processing device 100 may include, among other things, memory 101, core 102, compression circuitry 110 and decompression circuitry 120 that are coupled to one another. Processing device 100 may include one or more cores.

As shown in FIG. 1, processing device 100 may include compression circuitry 110. In various embodiments, compression circuitry 110 may include or may be disposed within a processor circuit, a SoC, a field-programmable gate array (FPGA), and/or the like. In some embodiments, compression circuitry 110 may include a processor circuit.

Figure 3:
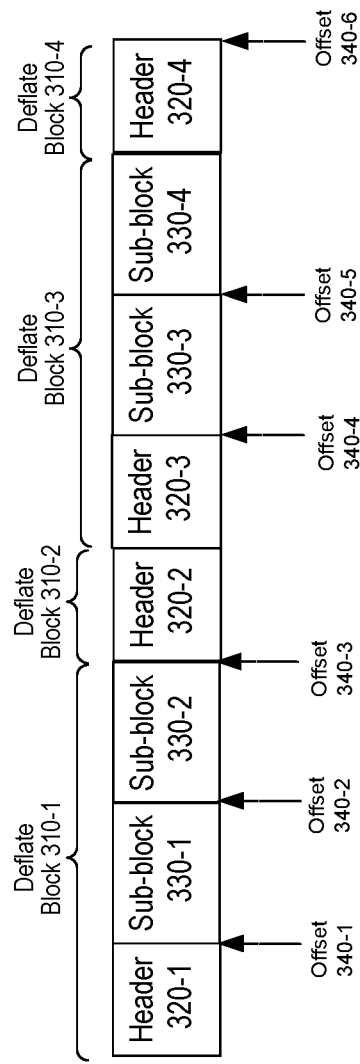
FIG. 3 illustrates a block diagram of a compressed source data according to various embodiments.

In some embodiments, compression circuitry 110 may be implemented in software, firmware, hardware, or a combination thereof. In various embodiments, compression circuitry 110 may be implemented in hardware configured to execute software, firmware, and/or the like to perform operations according to some embodiments. In some embodiments, compression circuitry 110 may be or may include a compression software application operative to compress data to generate compressed data according to some embodiments. In some embodiments, compression circuitry 110 may be or may include a compression software application executed by a processor circuit. Compression circuitry 110 may include a data input/output interface (not shown) configured to access source data 130. Compression circuitry 110 then compresses the source data to generate compressed data 138 (e.g., blocks and sub-blocks). An example of compressed data is depicted in FIG. 3 which will be described in further detail below.

In various embodiments, compressed data 138 may include compressed data formed of discrete blocks (e.g., a Deflate block or Deflate-based block). The blocks of compressed data may be formed of various block elements, including, without limitation, headers and sub-blocks.

In some embodiments, source data 130 may include uncompressed data. In various embodiments, source data 130 may include compressed data generated using conventional compression techniques (for instance, compressed data that does not include discrete sub-blocks or mini-blocks according to some embodiments). Accordingly, in some embodiments, compression circuitry 110 (for instance, in combination with decompression circuitry) may operate to transform conventional compressed data into compressed data 138 (that includes blocks and sub-blocks).

Compression circuitry 110 may receive source data 130 from various sources, including software applications or threads, hardware elements, data buffers, and/or the like. For instance, source data 130 may be obtained from database 150. In various embodiments, database 150 may include data from a big data platform, such as a data center, cloud computing environment, distributed computing environment, social networking platform, business analytics platform, and/or the like. In general, a big data platform may be defined by various characteristics of the data associated with the platform, such as the volume, velocity, variety, and/or value of the data. In some embodiments, database 150 may include a column-oriented (or columnar) database, for instance, of a DBMS. In general, a column-oriented database stores data by columns instead of by row. In a column-oriented database, each column may be stored separately, with attribute values of the same column stored contiguously. Although column-oriented databases are used in some examples, embodiments are not so limited as other types of databases may be used as database 150 or as source data 130 according to some embodiments. Non-limiting types of other databases may include relational databases, correlation databases, object databases, hierarchical databases, and/or the like.

In addition, database 150 and source data 130 may include databases or data sources from various proprietary and/or open source platforms, such as Oracle®, Microsoft® SQL Server, IBM® Informix®, SAP® Sybase®, and/or the like. In various embodiments, source data 130 may be in the form of a data sequence or stream received by or otherwise accessed by compression circuitry 110. A data buffer (not shown) may be used to store data, such as intermediate data, data waiting to be compressed, compressed data waiting to be transmitted, and/or the like. In some embodiments, compression circuitry 110 may access compressed data stored within the data buffer for transmission to a consumer of the compressed data.

Compression circuitry 110 is operative to compress source data 130 to generate compressed data 138. In various embodiments, compression circuitry 110 accesses or generates a checksum (e.g., cyclic redundancy check (CRC)) of the source data 130. The checksum of the uncompressed source data 130 is then compared with a calculated checksum (e.g., CRC) of the uncompressed data that is output from the decompressor (or compare the checksum of the uncompressed data that is output from the decompressor against a stored checksum of the uncompressed data) to verify, among other things, that the compressed data is not corrupted, which will be described in further detail below.

Additionally, compression circuitry 110 compresses source data based on compression configuration, which will also be described in further detail below.

In various embodiments, compression circuitry 110 may include a compression engine, algorithm, process, software application, firmware application, processor, co-processor, FPGA, and/or the like. Compression circuitry 110 may be configured to encode or compress data using a discrete compression process according to some embodiments. The discrete compression process may be based on one or more existing compression processes. Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like.

In some embodiments, the discrete compression process performed by compression circuitry 110 may include a variation of LZ77 compression and/or Deflate. For example, the discrete compression process may operate using a Deflate compression process except that, among other things, instead of generating compressed data formed of conventional Deflate blocks, the discrete compression process may generate discrete compressed data that includes discrete sub-blocks according to some embodiments. In various embodiments, the discrete compressed data may include Deflate blocks formed of one or more discrete sub-blocks. In general, and as described in more detail below, a conventional Deflate compression process may keep track of history information in each Deflate block. Accordingly, at any point in the Deflate-compressed data, such as for a particular Deflate block, there is history information of the preceding characters for a certain window (which may include data in one or more other Deflate blocks), such as 32 KB. A 32 KB sliding window means that the compressor (and decompressor) have a record of what the last 32768 (32*1024) characters were. Accordingly, decompressing data of an operation target stored in a Deflate block, requires decompressing at least an entire Deflate block as well as any blocks referred to in the historical information of the Deflate block (which may also include historical information referring to still other Deflate blocks, and so on). However, in some embodiments, the discrete compression process may use a LZ77-based and/or Deflate-based compression process, but may generate compressed data formed of, among other things, discrete blocks according to some embodiments instead of conventional Deflate blocks. For instance, in some embodiments, the discrete sub-blocks may not include historical information that references other discrete sub-blocks (the historical information may point to other data within the same discrete sub-block). In some embodiments, each discrete sub-block may include all of the information necessary to decompress the discrete sub-block and does not rely on other discrete sub-blocks in order to be decompressed. Although LZ77 and Deflate are used as examples, embodiments are not so limited as any compression process capable of being used according to some embodiments is contemplated herein.

In general, the LZ77 compression process operates by replacing repeated occurrences of data with references to previous occurrences of that data existing earlier in the input (uncompressed) data stream. A match is encoded by a pair of numbers called a length-distance pair ("distance" may be referred to as an "offset"). As such, the LZ77 compression process finds repeated substrings and replaces them with backward references (relative distance offsets). The LZ77 compression process can use a reference to a duplicated string if the relative distance is less than the maximal history size defined in the algorithm encoding (for instance, 32 KB in Deflate). The compressed data consists of a series of elements of two types: literal bytes (copy of the data) and pointers to replicated strings, where a pointer is represented as the pair <length, backward distance>. The various algorithms in the LZ77 family all find LZ77 string matches during compression, but encode the literals or references differently (for instance, Huffman codes in Deflate, simple byte-oriented packing in Snappy, and/or the like), and have different maximal history windows. In general, a literal may include raw encoded data (as opposed to data encoded as a length, distance pair).

To spot matches, the LZ77 encoder keeps track of some amount of the most recent data, such as the last 2 kB, 4 kB, 32 kB, and/or the like. The structure in which this data is held is called a "sliding window" or "history window" (accordingly, LZ77 is sometimes referred to as sliding window compression). The encoder keeps the most recent data within the sliding window to look for matches (and the decoder likewise will keep this data to interpret the matches the encoder refers to). Accordingly, at any point in the data, such as for a particular Deflate block, there is a record ("history" or "history information") of the preceding characters (which may be in one or more other Deflate blocks). A 32 KB sliding window means that the compressor (and decompressor) have a record of what the last 32768 (32*1024) characters were.

During LZ77 compression, byte patterns of a preceding (earlier or older) portion of a byte stream may be compared against a current portion (or current bit sequence) of the byte stream. If a sequence of bytes is found in the current portion that matches a sequence of bytes in the preceding portion (or preceding byte sequence), the sequence of bytes in the current portion is replaced with a reference to the same sequence of bytes in the earlier portion.

The reference that is inserted for the current byte sequence identifies the length of the current byte sequence and the location of the preceding byte sequence expressed, for instance, as a "distance" from the current byte sequence to the matching preceding byte sequence. As such, the LZ77 compression process encodes a byte sequence as a "length, distance pair" that is inserted in the byte stream in place of a current byte sequence. Upon decoding the compressed stream, when the decoder reaches the length, distance pair that is embedded in the byte stream, the decoder uses the distance part of the length, distance pair to refer back to the start of the matching byte sequence and reproduces the correct byte sequence of the decoded stream by reproducing a number of bytes from the start of the matching byte sequence that is equal to the length component of the length, distance pair.

A non-limiting example of an LZ77 compression process may be performed on the following illustrative sequence, recited in a form prior to compression: "ABCD BBBB BC CDE DEFG BBBB EFGH." During compression, the LZ77 compression process may locate the match "BBBB," having a length of 6 (including spaces). The matching "BBBB" sequences have a match offset (for instance, an intervening distance) of 15. The compressed sentence may be in the following form: "ABCD BBBB BC CDE DEFG @(6,15) EFGH," with "(6,15)" being the length and distance pair associated with the BBBB match.

The Deflate compression process is used as the bases of various compression platforms, such as gzip/Zlib and Winzip/PKzip. In general, Deflate uses a series of blocks (Deflate blocks) corresponding to successive blocks of input data. Each block may be compressed using a combination of the LZ77 compression process and Huffman coding. As described above, the LZ77 compression process operates to find repeated substrings and replaces the repeated substrings with references, such as relative distance offsets. The LZ77 compression process may use a reference to a duplicated string occurring in the same block or previous blocks, for instance, up to 32 KB previous input bytes (a "history" or "history information"). The compressed data may include a series of elements of two types: literal bytes and pointers to replicated strings (represented as the pair: <length, backward distance>. The LZ77 compression process operates to find string matches at each position Using data structures to efficiently index locations where matching strings may be found, the LZ77 compression process may operate to search a number of locations to determine a "best" match. The effort (for instance, the number of searches attempted) is specified by the compression level. For instance, gzip/Zlib defines a number of compression levels, ranging from 1 to 9, with 9 being the highest compression level and requiring the highest processing cost. A file may be represented as a series of tokens, where each token may represent a literal byte or a match of text that occurred previously. The tokens may be encoded using a variable-size code (for instance, a Huffman code followed by certain "extra bits").

As shown in FIG. 1, processing device 100 may include decompression circuitry 120. Decompression circuitry 120 is operable to decompress compressed data, such as discrete compressed data 138 to generate decompressed data 132. In some embodiments, decompression circuitry 120 may operate to generate index information 134 during the decompress-verify process (subsequent to or concurrently with the compression process). In some embodiments, index information 134 may include information for decompression circuitry to access data within discrete compressed data 138, such as data at a particular block (for instance, a Deflate block) and/or discrete sub-block of discrete compressed data 138. For example, index information 134 may include an index array or other data structure that may record offset information for Deflate blocks and/or sub-blocks of discrete compressed data 138. In various embodiments, the offset information may include a starting bit offset for each discrete block, a bit offset for a first token of each discrete block, a bit offset of headers associated with the discrete blocks, and/or the like. In some embodiments, decompression circuitry 120 may use index information 134 to decompress discrete compressed data 138 to generate decompressed data 132.

In various embodiments, index information 134 is provided to index table 140. Index table 140, in various embodiments, is generated by decompression circuitry 120. In one embodiment, decompression circuitry 120 include index table 140. Alternatively, decompression circuitry 120 does not include index table 140. For example, index table 140 is stored in memory.

It should be appreciated that it may be advantageous to perform some of the operations during decompression because the meta-data doesn't have to be stored for cold compressed data. When the data gets accessed from cold-storage, one can perform a sequential decompress. Additionally, the re-generated meta-data is available as long as the column is hot/warm, enabling further random-access reads to be efficient.

Decompression circuitry 120, in various embodiments, generates checksum data 136 in response to decompression circuitry 120 generating index information 134. As will be described in further detail below, checksum data 136 is a cumulative checksum corresponding to sub-blocks in the compressed data. Checksum data 136 is also provided to index table 140. Accordingly, index table 140 includes index information 134 as well as checksum data 136 corresponding to particular components of compressed data 138 (e.g., header, block, sub-block, etc.).

Decompression circuitry 120, in various embodiments, determines whether the checksum of the uncompressed source data (accessed/generated by compression circuitry 110) matches the checksum data 136 of the compressed data, and whether compression circuitry 110 generated the mini-blocks appropriately, which will be described in further detail below.

In various embodiments, compression circuitry 110 includes one output for outputting compressed data 138. As a result, compression circuitry 110, in various embodiments, is unable to concurrently generate and output index information 134 and/or checksum data 136. Accordingly, decompression circuitry 120 is able to (while not outputting decompressed data 132) generate index information 134 and/or checksum data 136 while compression circuitry 110 is generating compressed data 138. Alternatively, in some embodiments, the processing related to the index information is provided by the compression circuitry (during the verify flow). For example, the compression circuitry can buffer a limited number of some sizes of sub-blocks (e.g., 128) and then write out an output stream, or to a configuration space where state is saved.

In various embodiments, discrete compressed data 138 may include a Deflate (or Deflate-based) compression stream such that discrete compressed data 138 may be decompressed using a Deflate-compliant compressor. In various embodiments, to perform a random operation on discrete compressed data 138, such as decompressing discrete compressed data 132, decompression circuitry 120 may use index information 134 to determine which discrete block includes an operation target and where a corresponding header (for instance, Deflate header of a corresponding Deflate block) is located (see, for example, FIG. 3). The header would then be conceptually appended to the discrete sub-block and the discrete sub-block would be decompressed. This is done to gain the effect of decompressing the combined data without needing to actually append the data. In one embodiment, for example, if the decompressor supported appropriate gather functionality, then the header and the sub-block could be specified as entries on the gather list. Accordingly, to decompress a single element according to some embodiments, a discrete decompression process would only have to decompress, on average, half of a discrete block (compared with an entire column of data for compressed column-orientated data).

Figure 2:
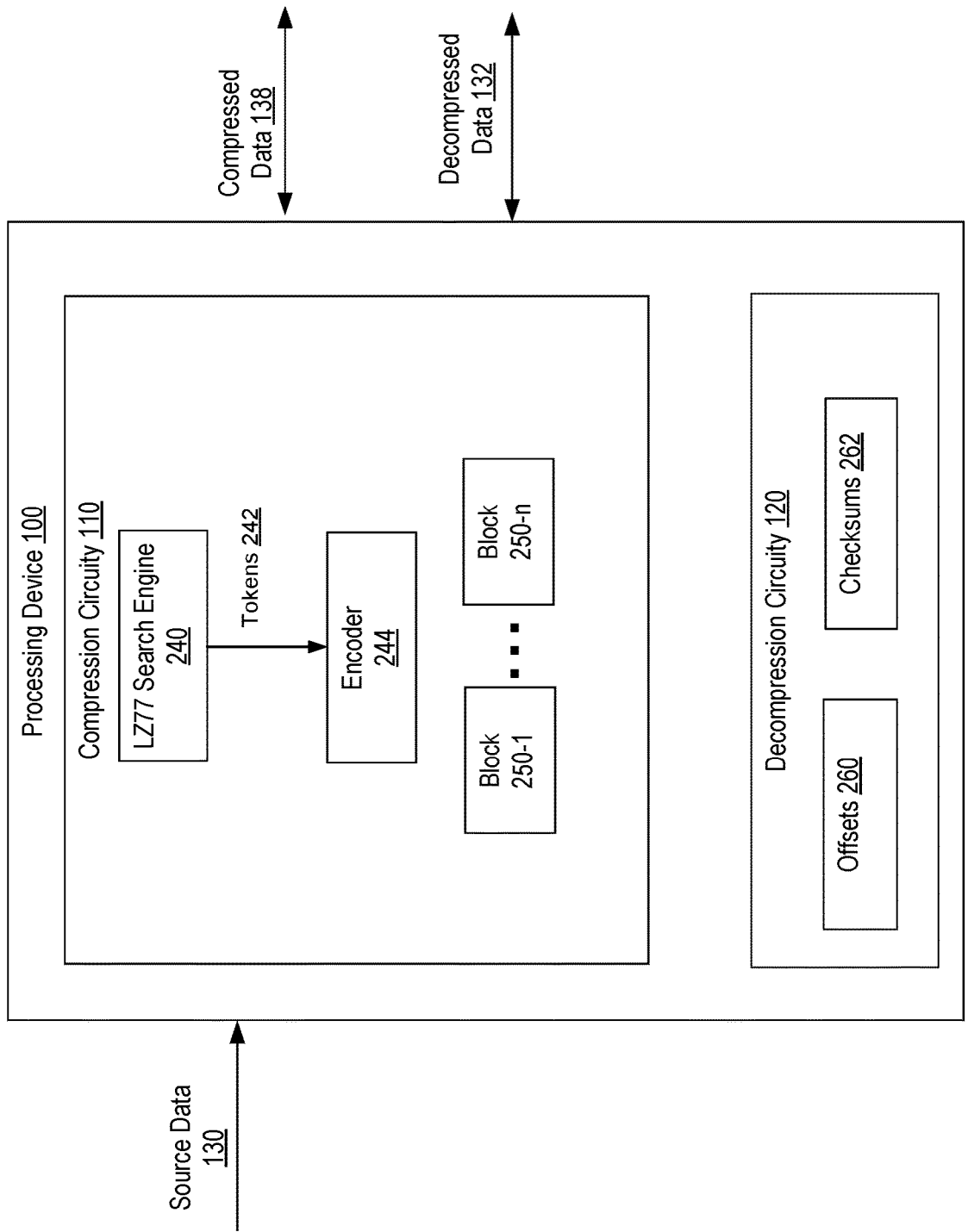
FIG. 2 illustrates a block diagram of a processing device including compression circuitry and decompression circuitry according to various embodiments.

FIG. 2 illustrates an example of an operating environment that may be representative of various embodiments. The operating environment depicted in FIG. 2 may include processing device 100 including, among other things, compression circuitry 110 and decompression circuitry 120. Compression circuitry 110 may be operative to generate discrete compressed data 138. In some embodiments, compression circuitry 110 may be implemented in hardware and/or software executed via processor circuit. In various embodiments, compression circuitry 110 may be configured to operate a LZ77-based and/or Deflate-based discrete compression process. In general, compression circuitry 110 may be configured to operate a discrete compression process according to some embodiments to compress data according to a Deflate-based compression process using discrete blocks in place of or in combination with conventional Deflate blocks.

As shown in FIG. 2, an LZ77 search engine 240 of compression circuitry 110 may receive source data 130. LZ77 search engine 240 may analyze source data 130 for repeated patterns. Repeated patterns of a certain length (for instance, greater than or equal to 3 characters) may be reduced to a length-distance pair token. The tokens 242 may be provided to an encoder 244, such as a Huffman encoder. Encoder 244 may operate to encode tokens 242, for instance, by encoding most-frequently seen tokens 242 with a minimum size bit symbol.

In various embodiments, encoder 244 may generate blocks 250-1 to 250-n. In some embodiments, blocks 250 may be Deflate blocks formed of discrete sub-blocks. In various embodiments, encoder may generate blocks 250 that include a predetermined number of discrete sub-blocks. For example, encoder 244 may generate a new Deflate block every n sub-blocks, where n may include 1, 2, 3, 4 and so on. Accordingly, in some embodiments, each Deflate block includes a certain number of integral, undivided discrete blocks (for instance, a sub-block may not span multiple Deflate blocks).

A discrete sub-block may be configured to include a certain amount of data. In some embodiments, the predetermined amount of data may include 1 kb, 2 kb, 3 kb, etc. It should be appreciated that the sub-block can include any predetermined amount of data. In some embodiments, each sub-block includes a predetermined amount of data (e.g., each sub-block includes 1 kb of data). In some embodiments, discrete blocks may have different amounts data. In some embodiments, discrete blocks may each have the same (or substantially similar) amount or limit on the amount of data. In various embodiments, each discrete block may include a fixed amount of about 1 KB of uncompressed data. In some embodiments, the amount of data may not be constrained from the Deflate standard and a sub-block may be generated after a first token 242 that reaches the next sub-block boundary.

A discrete compression process according to some embodiments may generate various compression configurations based on one or more characteristics, such as block size, sub-block size, number of sub-blocks in each Deflate block, and/or the like.

For example, a compression configuration including sub-block of size 1 KB with four discrete sub-blocks per Deflate block may have a compression configuration of ¼. In another example, a compression configuration may include ¹⁄₁₆ with a sub-block size of 1 KB and block size of 16 KB (for instance, 16 discrete blocks per high-level block).

In some embodiments, compression circuitry 110 truncates a last match so that the length does not cross into the next sub-block, by possibly encoding last few bytes as literals. As described above, the compression circuitry provided a predetermined sub-block size (e.g., 1 kb). However, the compression circuitry may generate a sub-block that is slightly larger than the predetermined sub-block size in order to save a last match that may extend beyond the sub-block having a predetermined size. If a sub-block is generated with a size that beyond the predetermined sub-block size, then the index table would include additional information to properly decompress the sub-blocks. For example, in one embodiment, the index table would further include the boundaries of a sub-block in both the compressed data stream and in uncompressed data stream.

In various embodiments, compression circuitry 110 may use one or more default compression configurations to generate discrete compressed data. In some embodiments, compression circuitry 110 may use an optimal compression configuration determined to provide one or more optimal compression characteristics (for instance, compression ratio, compression speed, and/or the like) for the data being compressed. In some embodiments, optimal compression configurations for a particular data source (for instance, a column-oriented database) may be stored, such as in memory or as meta data in a database associated with a data source, and may be looked up by compression circuitry 110 for use during a discrete compression process.

Decompression circuitry 120 is coupled to compression circuitry 110 and is operable to generate decompressed data 132, offsets 260 and checksums 262, which will be described in further detail below. Decompression circuitry 120, in various embodiments, is provided two flags (not currently in the Deflate scheme) as indicated in Table 1 below:

TABLE 1

| Disable_Decompress_Output | 1-bit | Doesn't write decompressed bytes to output stream |
|---|---|---|
| Index_Size | 3-bit | Defines sub-blocks (512 . . . 32k, etc.), zero disable features |

If the bits (with respect to Table 1) are both 0, then decompression occurs as a normal operation generating the uncompressed stream.

If disable_decompress_output is set, and index-size is 0, then decompression occurs as a normal operation. The checksum (e.g., CRC) is calculated but no decompressed output is written to the output stream. This is to aid some decompress-verify flows on checksum data.

If index_size is non-zero, then disable_decompress_output must be set. The following concerns the case where index_size is non-zero (i.e. where a sub-block scheme has been used while compressing). The index_size defines the sub-block size. The sub-block size is a power of 2 (>=512). In this mode, the expectation is that the act of decompressing is to verify the compressed bit-stream in entirety, as well as the formation of mini-blocks, via CRCs (and not really output the uncompressed data). The uncompressed data is written out from output accumulators in the decompression circuitry but suppressed from the write-port. The write-port is reserved instead for writing out the stream of bit-index and CRC meta-data per sub-block.

The decompression circuitry checks for the following to ensure valid construction of blocks/sub-blocks by the compression circuitry:

1. If a Deflate Block header is seen, and the cumulative number of output bytes is not a multiple of the mini-block size, then decompression circuitry returns an error. The exception to this are zero-length stored blocks.
2. If the output of a match token (reference, len-dist) straddles two mini-blocks, the decompression circuitry returns an error.
3. If a stored block is seen, and the size is not a multiple of the mini-block size, the decompression circuitry returns an error. This check can be done just for non-final blocks. This check should be done for blocks other than zero-length stored blocks.
4. If the output overflows, it is a non-recoverable error.

5. The normal distance check error that will be modified when there is a sub-block specified. After every sub-block, it is ensured that the valid-distance drops to 0 and then starts to count up again. Thus, a more stringent distance check is performed for the references when a sub-block has been specified. This guarantees that the overall deflate stream will also be well-formed.

It should be appreciated that above list of checks is non-limiting list. In various embodiments, more or less checks may be performed.

A general write flow is described below, according to some embodiments.

First, the compressor is configured with sub block size and sub-block mode.

Second, the source data is compressed and the CRC for the whole uncompressed data is determined.

Third, the decompressor is configured decompress-verify mode using CRCs but also with sub-block mode enabled.

Fourth, the decompressor does not output the uncompressed data but computes the CRC of the whole data stream and periodically outputting the cumulative CRC (e.g., checksums 262) up to a given point (e.g., offsets 260). For example, given the cumulative CRC at the start of a sub-block and the cumulative CRC at the end of the sub-block (and the size of the sub-block), one can compute the CRC of the sub-block, but neither cumulative CRC is the CRC of that sub-block (except for the case of the first sub-block, where the initial CRC is 0). Specifically, if the sub-block size was 100 bytes, the CRCs of the following regions are computed: (0 . . . 99), (0 . . . 199), (0 . . . 299), etc.

Fifth, the decompressor verifies if every sub-block was correctly generated in the deflate stream and checks the whole-file checksum from the decompressor against the one computed by the compressor.

A general read flow is described below, according to some embodiments.

If a whole column/file is needed, the decompressor is set up to read a normal deflate stream as usual.

If a random access is needed, and no meta-data is available (e.g., indices and the CRC data), the decompressor generates sub-block meta-data (the sub-block size used by the compressor has to be known at a minimum, but this can be a parameter for the whole database, or table).

For random access with meta-data available (e.g., indices and the CRC data), the starting sub-block position is determined and the decompressor is loaded with bit-stream containing the deflate header (e.g., parsing the Huffman tables and saving state). Then, a second job is submitted with the actual start of sub-block symbols after restoring the saved state.

FIG. 3 depicts an illustrative compressed data stream according to some embodiments. As shown in FIG. 3, a compressed data stream 300 may include various elements, including blocks 310, headers 320 and sub-blocks 330. In some embodiments, data stream 300 may include Deflate blocks 310, which may be formed of headers 320 and/or sub-blocks 330. It should be appreciated that sub-blocks 30 represent Huffman encoded data, and blocks 310-2 and 310-4 are zero-length stored blocks that do not have any data following them.

In various embodiments, a decompression circuitry 120 may generate index information 134 (e.g., offsets 340) that may include element information associated with elements of discrete compressed data stream, such as Deflate blocks 310, headers 320, and sub-blocks 330.

In some embodiments, index information 134 may include an index array (e.g., index table 140) configured to include element information such as offsets 340. Non-limiting examples of offsets may include the starting bit offset of each discrete block, as the discrete blocks are not byte-aligned. In various embodiments, the arrow references of index information 134 (e.g., offsets 340) depicted in FIG. 3 may represent entries into the index array.

In various embodiments, the output of the offsets 340 is generated in the following circumstances/rules:

1. When the number of bytes "written" out of the output accumulator is a multiple of the sub-block size, then the input bit offset of the following token is written to the output stream.
2. At the end of decompression, if any bytes were "written" since the last output, then the bit offset of the end of the input stream is written.
3. When a deflate header is finished being parsed, and it is not a zero-length stored block, the bit offset of the next token is written.

Additionally, in some embodiments, when a bit offset is written, the CRC of all of the input data up to that point is also written. As a result, 8 bytes are written at a time.

Table 2 below, is an example index table 140 that includes the offset and corresponding checksum (e.g., CRC) with respect to compressed data stream 300.

TABLE 2

| Offset | CRC |
| --- | --- |
| Offset 340-1 | Initial CRC (0) |
| Offset 340-2 | CRC of data from Offset 340-1 to Offset 340-2 |
| Offset 340-3 | CRC of data from Offset 340-1 to Offset 340-3 |
| Offset 340-4 | Same as previous entry |
| Offset 340-5 | CRC of data from Offset 340-1 to Offset 340-5 |
| Offset 340-6 | CRC of data from Offset 340-1 to Offset 340-6 |

Referring to Table 2, it should be appreciated that the CRC is the CRC of the uncompressed data represented by the compressed data between offsets (e.g., between offset 340-1 and 340-3). In various embodiments, the index table can include bit-offsets for other items in the compressed bit-stream that do not change the uncompressed byte-stream such as, but not limited to, end-of-block symbols, empty stored-blocks used for padding the compressed bit-stream, etc.

Referring to the circumstances/rules to generate the index table above and data stream 300, Table 2 (e.g., index table) is created as follows:

Assuming that offset 340-1 is at the start of the file, the initial CRC is 0. When the parser gets to the end of header 320-1, it will write the bit-offset 340-1 to the output using rule 3. The CRC would be 0.

When the decompressor "output" the bytes up to the end of sub-block 330-1, it would write the bit-offset 340-2 using rule 1. The CRC would include the data from 340-1 to 340-2. The same thing happens at the end of sub-block 330-2.

When the decompressor finishes parsing header 320-2, it is the exception case of rule 3, so nothing is written. When the decompressor finishes parsing header 320-3, by rule 3, it writes out offset 340-4. At the end of sub-block 330-3, the same thing happens as at offset 340-2.

When the decompressor gets to the end of block header 320-4, assuming that the input file was not a multiple of the mini-block size, rule 1 would not apply. At the end of header 320-4, rule 3 would not apply. Then, since this is at the end of the file, rule 2 writes offset 340-6. If the file size were a multiple of the sub-block size, then the offset of the start of header 320-4 would be written instead, and then no further offsets would be written.

Referring to at least Table 2 above, in some embodiments, the checksum (e.g., CRC) of a sub-block is defined to be the checksum of all of the data up to the end of the sub-block (e.g., inclusive of all preceding sub-blocks). This enables to generate the sub-block checksum and the full deflate stream checksum using the same circuit (since a snapshot of the checksum state at additional points is needed and subsequently outputted).

FIG. 4 depicts a flow diagram of method 400 for supporting random access of compressed data, according to an embodiment.

At 410, a compression configuration to compress source data is determined. For example, compression circuitry 110 accesses (or generates) the compression configuration (e.g., sub-block size, number of sub-blocks in a block, etc.) for compressing the source data.

At 420, a checksum of the source data in an uncompressed state is generated. For example, compression circuitry accesses (or generates) a CRC of the uncompressed source data, At 430, the source data is compressed into at least one block based on the compression configuration. For example, the block of compressed data includes a plurality of sub-blocks that each include a predetermined size (e.g., ~1 kb) and a block header of the block.

At 440, while the decompression circuitry is not outputting a decompressed data stream of the source data, the decompression circuitry generates index information corresponding to the plurality of sub-blocks. For example, an index array is generated that records the bit offset of the first token/symbol of each sub-block and the starting bit offset of the Deflate block headers.

At 450, in response to generating the index information, a checksum of the compressed source data associated with the plurality of sub-blocks is generated. For example, the index array also records the CRC at each sub-block. The CRC of at each sub-block is the CRC of all data up the end of the particular sub-block (inclusive of all preceding sub-blocks).

At 460, it is determined whether the checksum of the source data in the uncompressed format matches the checksum of the compressed source data. For example, the CRC of the uncompressed source data (generated by the compression circuitry) is compared with the CRC of the compressed source data (generated by the decompression circuitry). If the CRCs are the same then it is assumed that the source data was compressed without any errors/bugs. If the CRCs are not the same then it is assume that the compression of the source data may include errors/bugs.

FIG. 5A is a block diagram illustrating a micro-architecture for a processor 500 that implements the processing device including heterogeneous cores in accordance with one embodiment of the disclosure. Specifically, processor 500 depicts an in-order architecture core and a register renaming logic, out-of-order issue/execution logic to be included in a processor according to at least one embodiment of the disclosure.

Processor 500 includes a front end unit 530 coupled to an execution engine unit 550, and both are coupled to a memory unit 570. The processor 500 may include a reduced instruction set computing (RISC) core, a complex instruction set computing (CISC) core, a very long instruction word (VLIW) core, or a hybrid or alternative core type. As yet another option, processor 500 may include a special-purpose core, such as, for example, a network or communication core, compression engine, graphics core, or the like. In one embodiment, processor 500 may be a multi-core processor or may be part of a multi-processor system.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 540 may be implemented using various different mechanisms. Examples of suitable mechanisms include, but are not limited to, look-up tables, hardware implementations, programmable logic arrays (PLAs), microcode read only memories (ROMs), etc. The instruction cache unit 534 is further coupled to the memory unit 570. The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations (RS), central instruction window, etc. The scheduler unit(s) 556 is coupled to the physical register file(s) unit(s) 558. Each of the physical register file(s) units 558 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 558 is overlapped by the retirement unit 554 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

In one implementation, processor 500 may be the same as processing device 100 as described with respect to FIGS. 1 and 2.

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 556, physical register file(s)

unit(s) 558, and execution cluster(s) 560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 is coupled to the memory unit 570, which may include a data prefetcher 580, a data TLB unit 572, a data cache unit (DCU) 574, and a level 2 (L2) cache unit 576, to name a few examples. In some embodiments DCU 574 is also known as a first level data cache (L1 cache). The DCU 574 may handle multiple outstanding cache misses and continue to service incoming stores and loads. It also supports maintaining cache coherency. The data TLB unit 572 is a cache used to improve virtual address translation speed by mapping virtual and physical address spaces. In one exemplary embodiment, the memory access units 564 may include a load unit, a store address unit, and a store data unit, each of which is coupled to the data TLB unit 572 in the memory unit 570. The L2 cache unit 576 may be coupled to one or more other levels of cache and eventually to a main memory.

In one embodiment, the data prefetcher 580 speculatively loads/prefetches data to the DCU 574 by automatically predicting which data a program is about to consume. Prefeteching may refer to transferring data stored in one memory location of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 500 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 5B is a block diagram illustrating an in-order pipeline and a register renaming stage, out-of-order issue/execution pipeline implemented by processor 500 of FIG. 5A according to some embodiments of the disclosure. The solid lined boxes in FIG. 5B illustrate an in-order pipeline, while the dashed lined boxes illustrates a register renaming, out-of-order issue/execution pipeline. In FIG. 5B, a processor 500 as a pipeline includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524. In some embodiments, the ordering of stages 502-524 may be different than illustrated and are not limited to the specific ordering shown in FIG. 5B.

Figure 6:
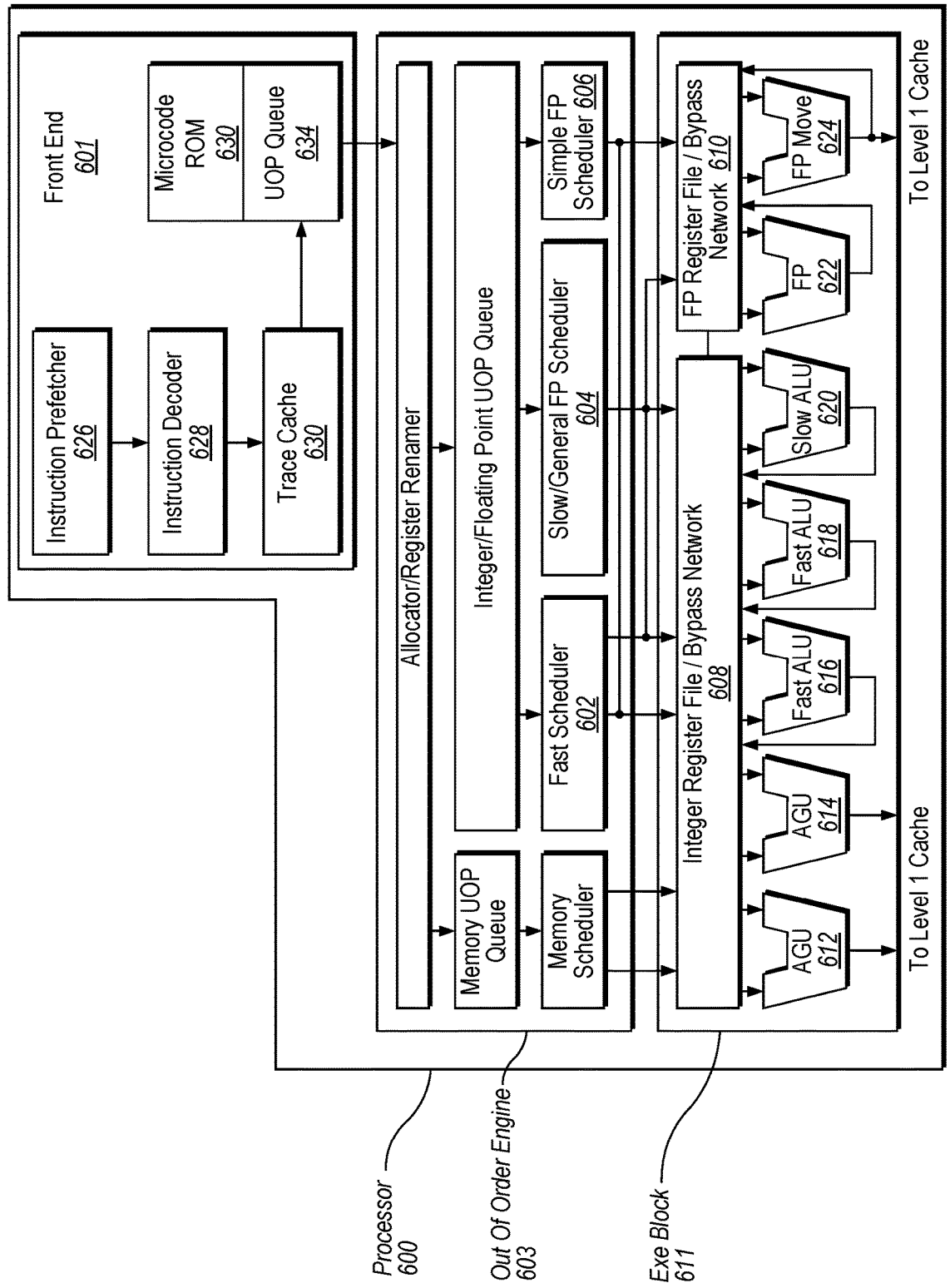
FIG. 6 is a block diagram illustrating a micro-architecture for a processor in accordance with one embodiment of the disclosure.

FIG. 6 illustrates a block diagram of the micro-architecture for a processor 600 (e.g., processing device 100) that includes hybrid cores in accordance with one embodiment of the disclosure. In some embodiments, an instruction in accordance with one embodiment can be implemented to operate on data elements having sizes of byte, word, double-word, quadword, etc., as well as datatypes, such as single and double precision integer and floating point datatypes. In one embodiment the in-order front end 601 is the part of the processor 600 that fetches instructions to be executed and prepares them to be used later in the processor pipeline.

The front end 601 may include several units. In one embodiment, the instruction prefetcher 626 fetches instructions from memory and feeds them to an instruction decoder 628 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 630 takes decoded uops and assembles them into program ordered sequences or traces in the uop queue 634 for execution. When the trace cache 630 encounters a complex instruction, the microcode ROM 632 provides the uops needed to complete the operation.

Some instructions are converted into a single micro-op, whereas others need several micro-ops to complete the full operation. In one embodiment, if more than four micro-ops are needed to complete an instruction, the decoder 628 accesses the microcode ROM 632 to do the instruction. For one embodiment, an instruction can be decoded into a small number of micro ops for processing at the instruction decoder 628. In another embodiment, an instruction can be stored within the microcode ROM 632 should a number of micro-ops be needed to accomplish the operation. The trace cache 630 refers to an entry point programmable logic array (PLA) to determine a correct micro-instruction pointer for reading the micro-code sequences to complete one or more instructions in accordance with one embodiment from the micro-code ROM 632. After the microcode ROM 632 finishes sequencing micro-ops for an instruction, the front end 601 of the machine resumes fetching micro-ops from the trace cache 630.

The out-of-order execution engine 603 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 602, slow/general floating point scheduler 604, and simple floating point scheduler 606. The uop schedulers 602, 604, 606, determine when a uop is ready to execute based on the readiness of their dependent input register operand sources and the availability of the execution resources the uops need to complete their operation. The fast scheduler 602 of one embodiment can schedule on each half of the main clock cycle while the other schedulers can only schedule once per main processor clock cycle. The schedulers arbitrate for the dispatch ports to schedule uops for execution.

Register files 608, 610, sit between the schedulers 602, 604, 606, and the execution units 612, 614, 616, 618, 620, 622, 624 in the execution block 611. There is a separate register file 608, 610, for integer and floating point operations, respectively. Each register file 608, 610, of one embodiment also includes a bypass network that can bypass or forward just completed results that have not yet been written into the register file to new dependent uops. The integer register file 608 and the floating point register file 610 are also capable of communicating data with the other. For one embodiment, the integer register file 608 is split into two separate register files, one register file for the low order 32 bits of data and a second register file for the high order 32 bits of data. The floating point register file 610 of one embodiment has 128 bit wide entries because floating point instructions typically have operands from 64 to 128 bits in width.

The execution block 611 contains the execution units 612, 614, 616, 618, 620, 622, 624, where the instructions are actually executed. This section includes the register files 608, 610, that store the integer and floating point data operand values that the micro-instructions need to execute. The processor 600 of one embodiment is comprised of a number of execution units: address generation unit (AGU) 612, AGU 614, fast ALU 616, fast ALU 618, slow ALU 620, floating point ALU 622, floating point move unit 624. For one embodiment, the floating point execution blocks 622, 624, execute floating point, MMX, SIMD, and SSE, or other operations. The floating point ALU 622 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 616, 618. The fast ALUs 616, 618, of one embodiment can execute fast operations with an effective latency of half a clock cycle. For one embodiment, most complex integer operations go to the slow ALU 620 as the slow ALU 620 includes integer execution hardware for long latency type of operations, such as a multiplier, shifts, flag logic, and branch processing. Memory load/store operations are executed by the AGUs 612, 614. For one embodiment, the integer ALUs 616, 618, 620, are described in the context of performing integer operations on 64 bit data operands. In alternative embodiments, the ALUs 616, 618, 620, can be implemented to support a variety of data bits including 16, 32, 128, 256, etc. Similarly, the floating point units 622, 624, can be implemented to support a range of operands having bits of various widths. For one embodiment, the floating point units 622, 624, can operate on 128 bits wide packed data operands in conjunction with SIMD and multimedia instructions.

In one embodiment, the uops schedulers 602, 604, 606, dispatch dependent operations before the parent load has finished executing. As uops are speculatively scheduled and executed in processor 600, the processor 600 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 600 also includes logic to implement store address prediction for memory disambiguation according to embodiments of the disclosure. In one embodiment, the execution block 611 of processor 600 may include a store address predictor (not shown) for implementing store address prediction for memory disambiguation.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions below, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 7:
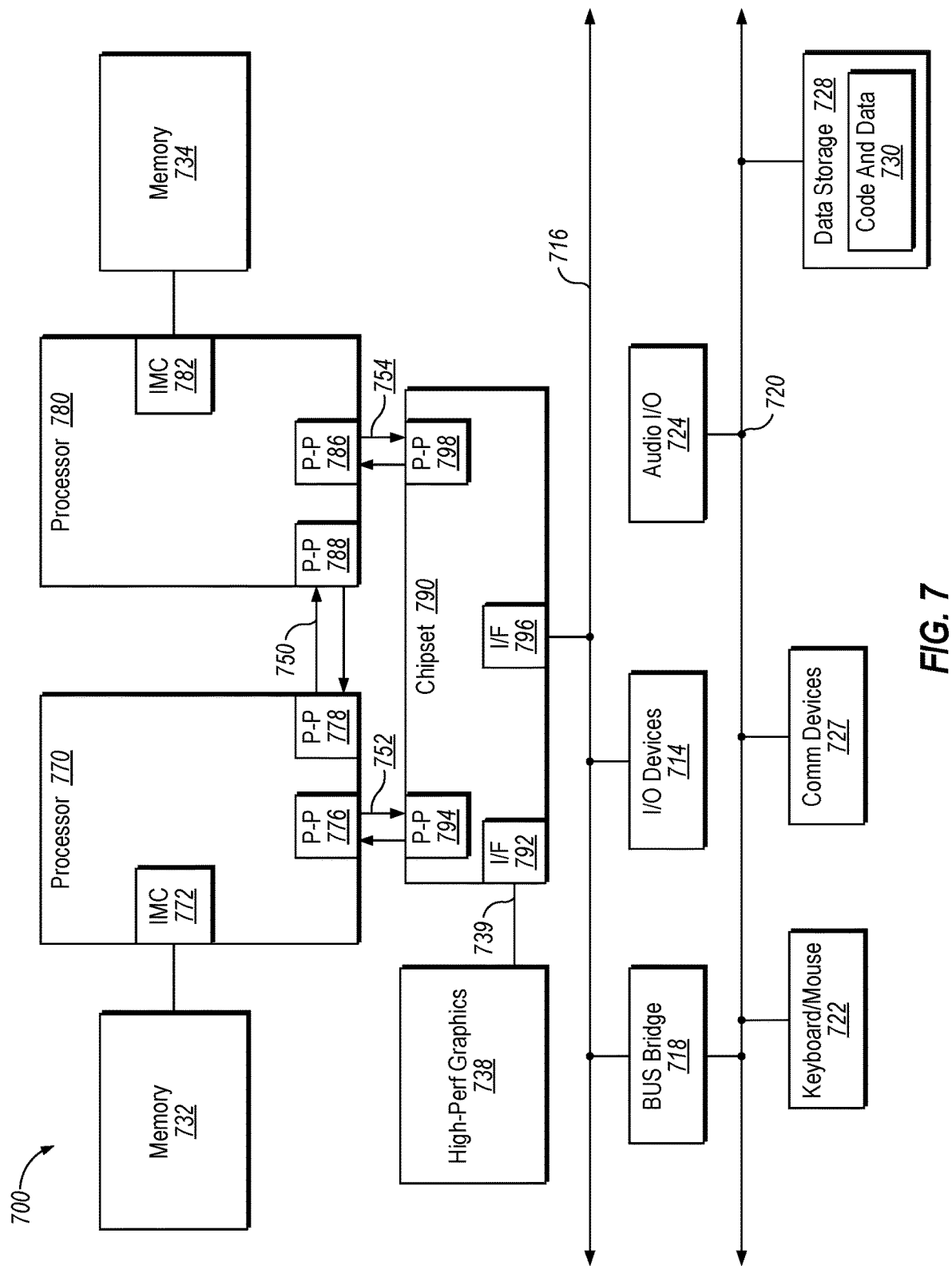
FIG. 7 is a block diagram illustrating a system in which an embodiment of the disclosure may be used.

Referring now to FIG. 7, shown is a block diagram illustrating a system 700 in which an embodiment of the disclosure may be used. As shown in FIG. 7, multiprocessor system 700 is a point-to-point interconnect system, and includes a first processor 770 and a second processor 780 coupled via a point-to-point interconnect 750. While shown with only two processors 770, 780, it is to be understood that the scope of embodiments of the disclosure is not so limited. In other embodiments, one or more additional processors may be present in a given processor. In one embodiment, the multiprocessor system 700 may implement hybrid cores as described herein.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Figure 8:
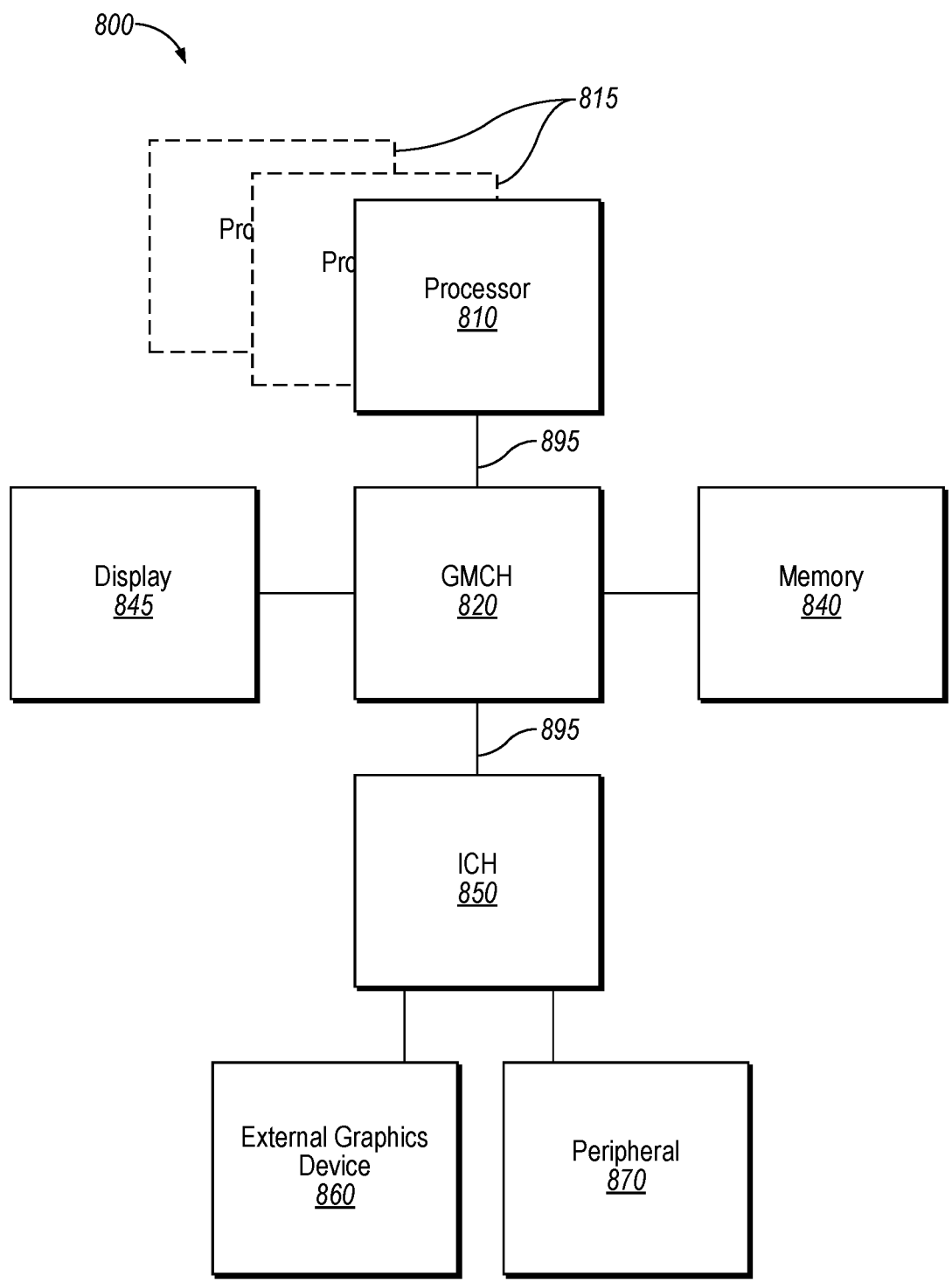
FIG. 8 is a block diagram illustrating a system in which an embodiment of the disclosure may operate.

Referring now to FIG. 8, shown is a block diagram of a system 800 in which one embodiment of the disclosure may operate. The system 800 may include one or more processors 810, 815, which are coupled to graphics memory controller hub (GMCH) 820. The optional nature of additional processors 815 is denoted in FIG. 8 with broken lines. In one embodiment, processors 810, 815 implement hybrid cores according to embodiments of the disclosure.

Each processor 810, 815 may be some version of the circuit, integrated circuit, processor, and/or silicon integrated circuit as described above. However, it should be noted that it is unlikely that integrated graphics logic and integrated memory control units would exist in the processors 810, 815. FIG. 8 illustrates that the GMCH 820 may be coupled to a memory 840 that may be, for example, a dynamic random access memory (DRAM). The DRAM may, for at least one embodiment, be associated with a non-volatile cache.

The GMCH 820 may be a chipset, or a portion of a chipset. The GMCH 820 may communicate with the processor(s) 810, 815 and control interaction between the processor(s) 810, 815 and memory 840. The GMCH 820 may also act as an accelerated bus interface between the processor(s) 810, 815 and other elements of the system 800. For at least one embodiment, the GMCH 820 communicates with the processor(s) 810, 815 via a multi-drop bus, such as a frontside bus (FSB) 895.

Furthermore, GMCH 820 is coupled to a display 845 (such as a flat panel or touchscreen display). GMCH 820 may include an integrated graphics accelerator. GMCH 820 is further coupled to an input/output (I/O) controller hub (ICH) 850, which may be used to couple various peripheral devices to system 800. Shown for example in the embodiment of FIG. 8 is an external graphics device 860, which may be a discrete graphics device, coupled to ICH 850, along with another peripheral device 870.

Alternatively, additional or different processors may also be present in the system 800. For example, additional processor(s) 815 may include additional processors(s) that are the same as processor 810, additional processor(s) that are heterogeneous or asymmetric to processor 810, accelerators (such as, e.g., graphics accelerators or digital signal processing (DSP) units), field programmable gate arrays, or any other processor. There can be a variety of differences between the processor(s) 810, 815 in terms of a spectrum of metrics of merit including architectural, micro-architectural, thermal, power consumption characteristics, and the like. These differences may effectively manifest themselves as asymmetry and heterogeneity amongst the processors 810, 815. For at least one embodiment, the various processors 810, 815 may reside in the same die package.

Figure 9:
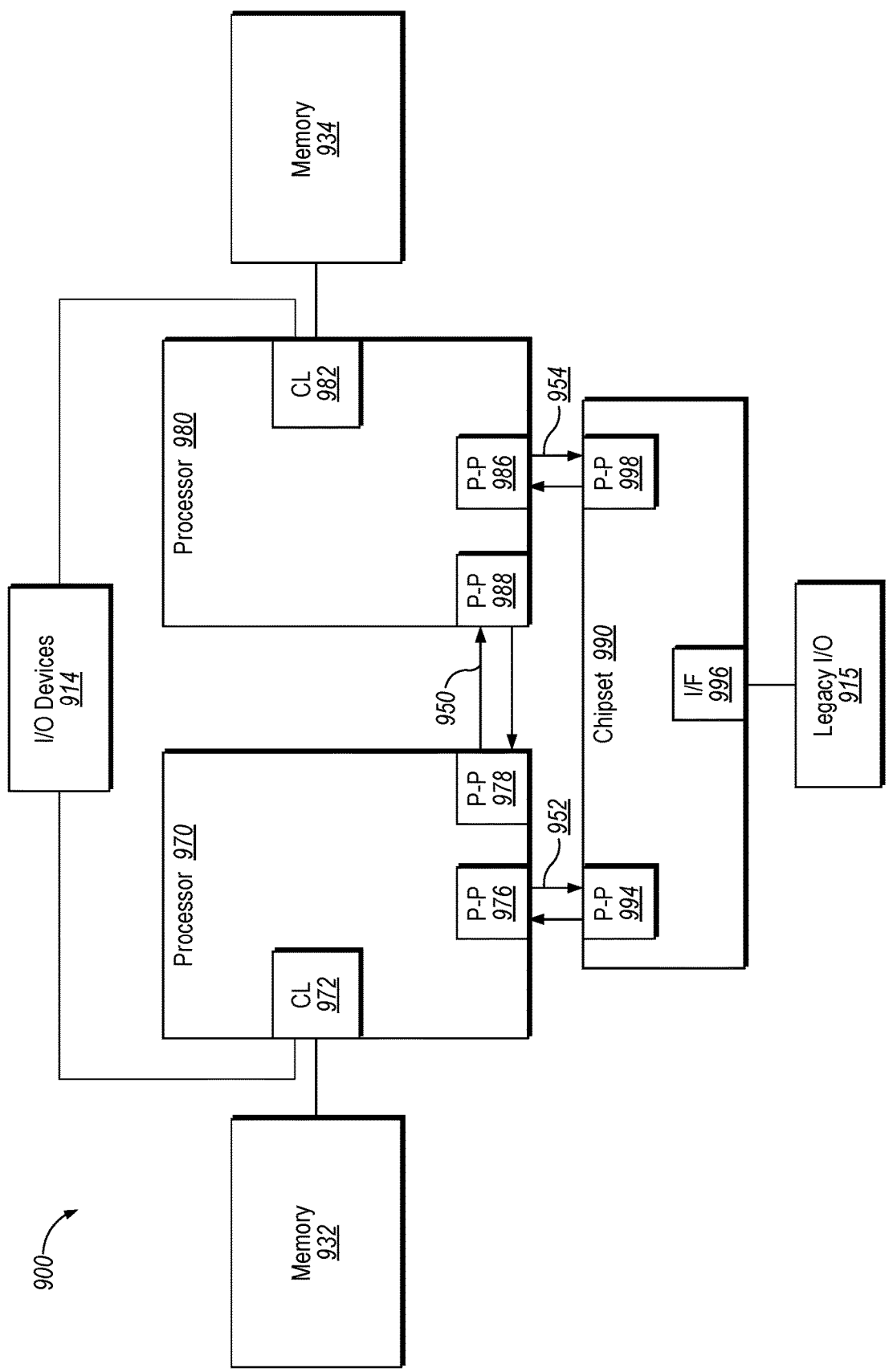
FIG. 9 is a block diagram illustrating a system in which an embodiment of the disclosure may operate.

Referring now to FIG. 9, shown is a block diagram of a system 900 in which an embodiment of the disclosure may operate. FIG. 9 illustrates processors 970, 980. In one embodiment, processors 970, 980 may implement hybrid cores as described above. Processors 970, 980 may include integrated memory and I/O control logic ("CL") 972 and 982, respectively and intercommunicate with each other via point-to-point interconnect 950 between point-to-point (P-P) interfaces 978 and 988 respectively. Processors 970, 980 each communicate with chipset 990 via point-to-point interconnects 952 and 954 through the respective P-P interfaces 976 to 994 and 986 to 998 as shown. For at least one embodiment, the CL 972, 982 may include integrated memory controller units. CLs 972, 982 may include I/O control logic. As depicted, memories 932, 934 coupled to CLs 972, 982 and I/O devices 914 are also coupled to the control logic 972, 982. Legacy I/O devices 915 are coupled to the chipset 990 via interface 996.

Figure 10:
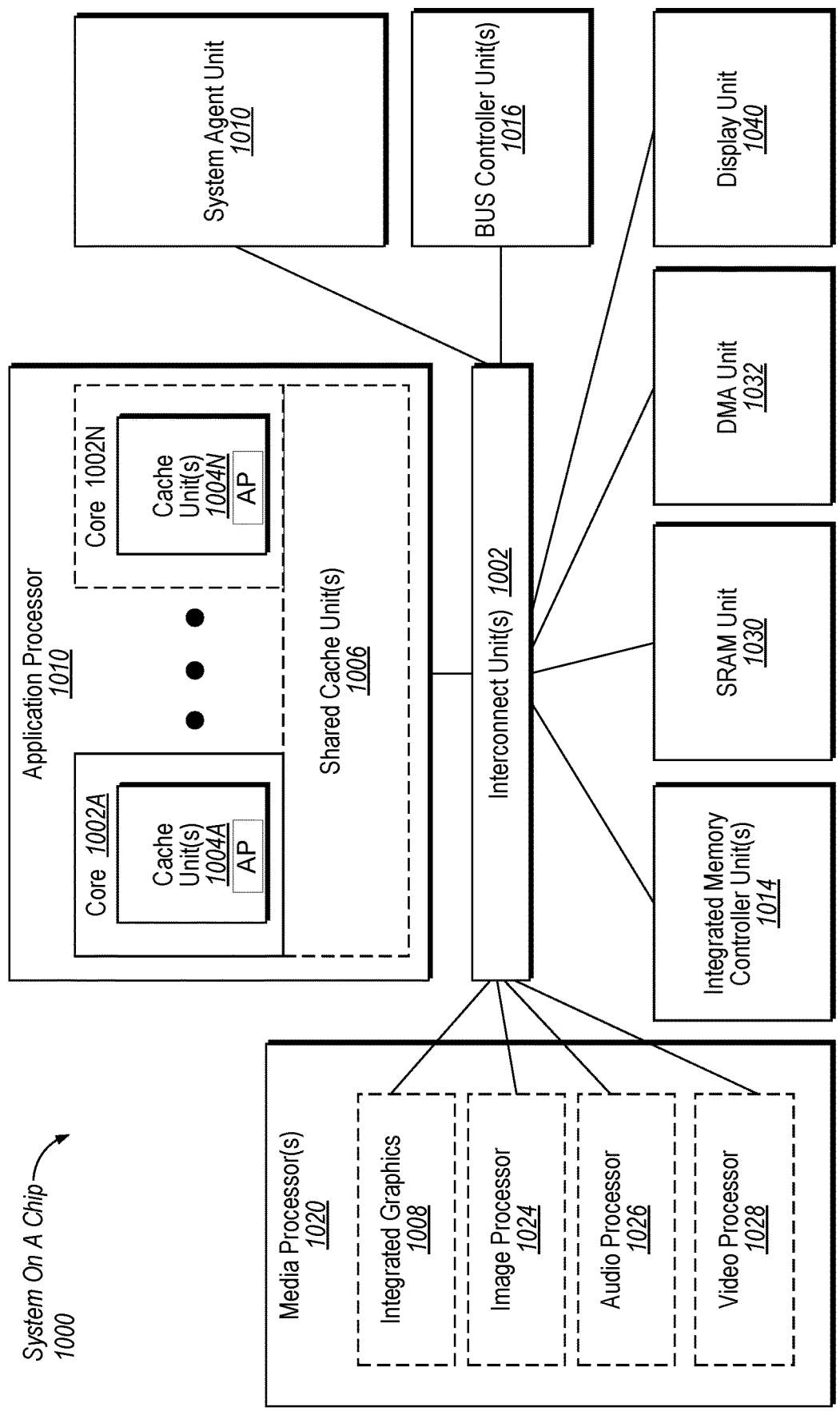
FIG. 10 is a block diagram illustrating a System-on-a-Chip (SoC) according to an embodiment of the disclosure.

Embodiments may be implemented in many different system types. FIG. 10 is a block diagram of a SoC 1000 in accordance with an embodiment of the present disclosure. Dashed lined boxes are optional features on more advanced SoCs. In FIG. 10, an interconnect unit(s) 1012 is coupled to: an application processor 1020 which includes a set of one or more cores 1002A-N and shared cache unit(s) 1006; a system agent unit 1010; a bus controller unit(s) 1016; an integrated memory controller unit(s) 1014; a set or one or more media processors 1018 which may include integrated graphics logic 1008, an image processor 1024 for providing still and/or video camera functionality, an audio processor 1026 for providing hardware audio acceleration, and a video processor 1028 for providing video encode/decode acceleration; an static random access memory (SRAM) unit 1030; a direct memory access (DMA) unit 1032; and a display unit 1040 for coupling to one or more external displays. In one embodiment, a memory module may be included in the integrated memory controller unit(s) 1014. In another embodiment, the memory module may be included in one or more other components of the SoC 1000 that may be used to access and/or control a memory. The application processor 1020 may include a store address predictor for implementing hybrid cores as described in embodiments herein.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof.

In some embodiments, one or more of the cores 1002A-N are capable of multi-threading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture and/or instruction set. For example, some of the cores 1002A-N may be in order while others are out-of-order. As another example, two or more of the cores 1002A-N may be capable of execution the same instruction set, while others may be capable of executing only a subset of that instruction set or a different instruction set.

The application processor 1020 may be a general-purpose processor, such as a Core™ i3, i5, i7, 2 Duo and Quad, Xeon™, Itanium™, Atom™ or Quark™ processor, which are available from Intel™ Corporation, of Santa Clara, Calif. Alternatively, the application processor 1020 may be from another company, such as ARM Holdings™, Ltd, MIPS™, etc. The application processor 1020 may be a special-purpose processor, such as, for example, a network or communication processor, compression engine, graphics processor, co-processor, embedded processor, or the like. The application processor 1020 may be implemented on one or more chips. The application processor 1020 may be a part of and/or may be implemented on one or more substrates using any of a number of process technologies, such as, for example, BiCMOS, CMOS, or NMOS.

Figure 11:
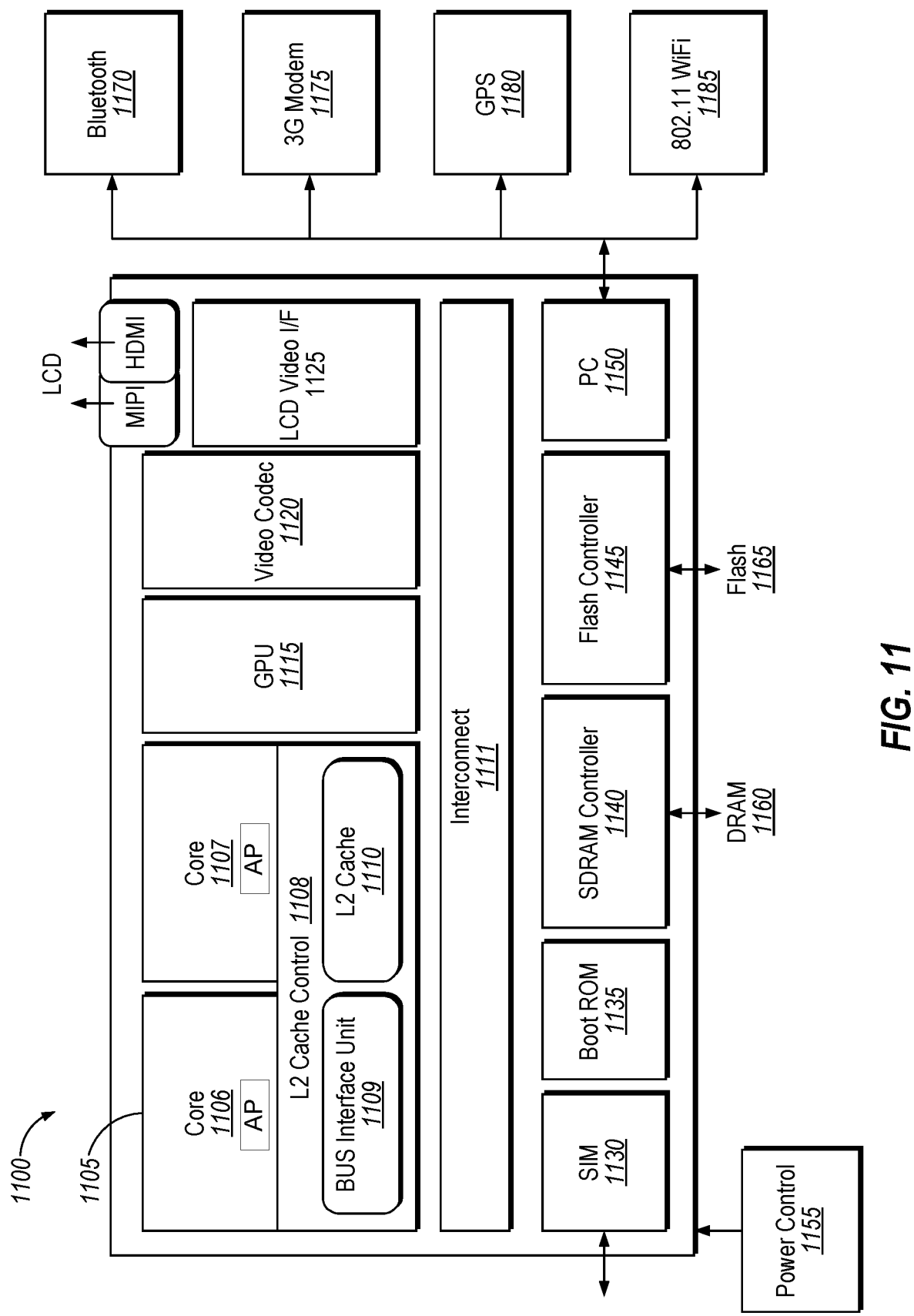
FIG. 11 is a block diagram illustrating a SoC design according to an embodiment of the disclosure.

FIG. 11 is a block diagram of an embodiment of a system on-chip (SoC) design in accordance with the present disclosure. As a specific illustrative example, SoC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1100 includes 2 cores-1106 and 1107. Cores 1106 and 1107 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1111 includes an on-chip interconnect, such as an IOSF, AMBA, or other interconnect discussed above, which potentially implements one or more aspects of the described disclosure. In one embodiment, cores 1106, 1107 may implement hybrid cores as described in embodiments herein.

Interconnect 1111 provides communication channels to the other components, such as a Subscriber Identity Module (SIM) 1130 to interface with a SIM card, a boot ROM 1135 to hold boot code for execution by cores 1106 and 1107 to initialize and boot SoC 1100, a SDRAM controller 1140 to interface with external memory (e.g. DRAM 1160), a flash controller 1145 to interface with non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the disclosure described herein. In addition, the system 1100 illustrates peripherals for communication, such as a Bluetooth module 1170, 3G modem 1175, GPS 1180, and Wi-Fi 1185.

Figure 12:
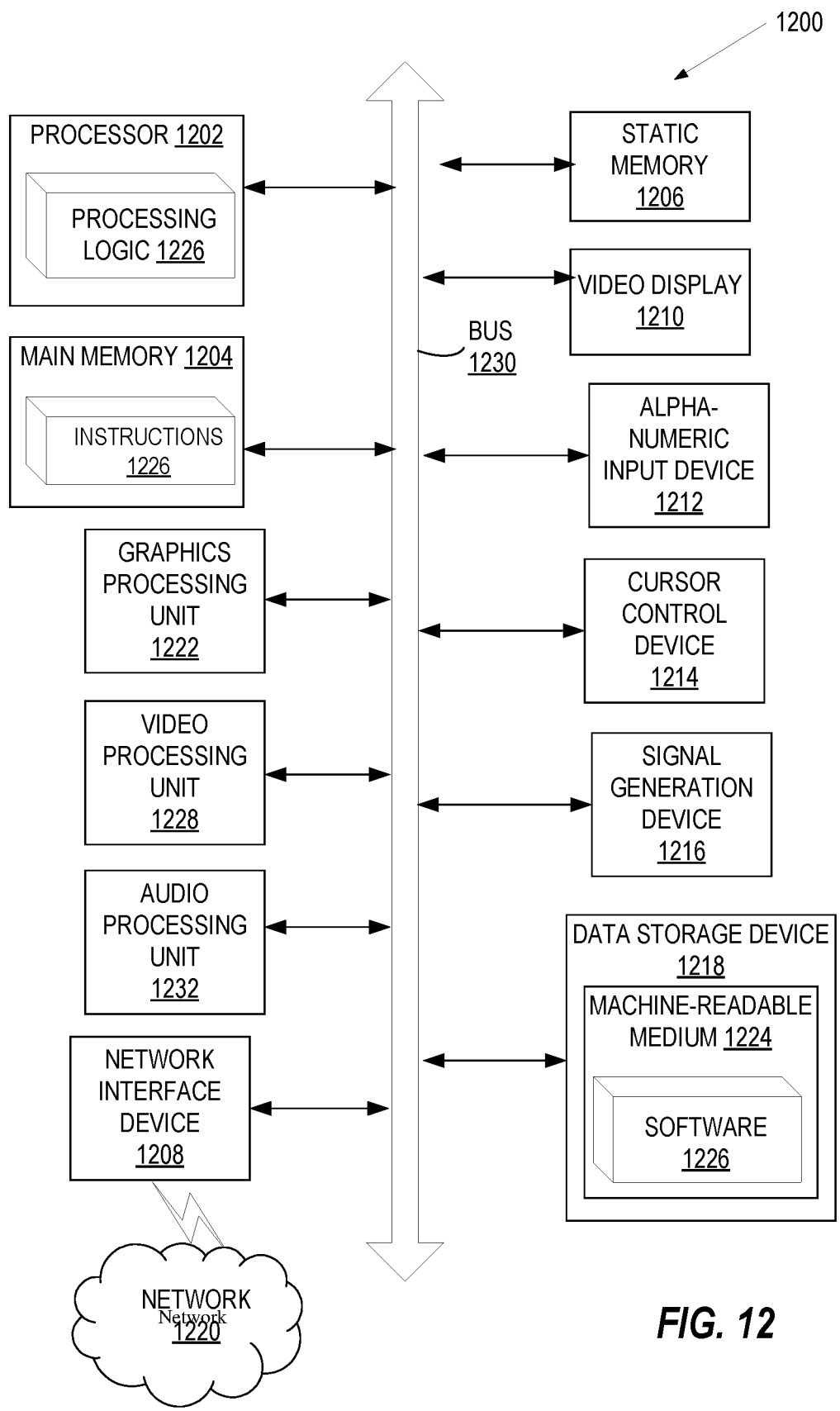
FIG. 12 illustrates a block diagram illustrating a computer system according to an embodiment of the disclosure.

FIG. 12 illustrates a diagrammatic representation of a machine in the example form of a computer system 1200 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1200 includes a processing device 1202, a main memory 1204 (e.g., read-only memory (ROM), flash memory, dynamic random access memory (DRAM) (such as synchronous DRAM (SDRAM) or DRAM (RDRAM), etc.), a static memory 1206 (e.g., flash memory, static random access memory (SRAM), etc.), and a data storage device 1218, which communicate with each other via a bus 1230.

Processing device 1202 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. In one embodiment, processing device 1202 may include one or more processing cores. The processing device 1202 is configured to execute the processing logic 1226 for performing the operations and steps discussed herein. For example, processing logic 1226 may perform operations as described in FIG. 4.

The computer system 1200 may further include a network interface device 1208 communicably coupled to a network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker). Furthermore, computer system 1200 may include a graphics processing unit 1222, a video processing unit 1228, and an audio processing unit 1232.

The data storage device 1218 may include a machine-accessible storage medium 1224 on which is stored software 1226 implementing any one or more of the methodologies of functions described herein, such as implementing store address prediction for memory disambiguation as described above. The software 1226 may also reside, completely or at least partially, within the main memory 1204 as instructions 1226 and/or within the processing device 1202 as processing logic 1226 during execution thereof by the computer system 1200; the main memory 1204 and the processing device 1202 also constituting machine-accessible storage media.

The machine-readable storage medium 1224 may also be used to store instructions 1226 implementing store address prediction for hybrid cores such as described according to embodiments of the disclosure. While the machine-accessible storage medium 1128 is shown in an example embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the present disclosure. The term "machine-accessible storage medium" shall accordingly be taken to include, but not be limited to, solid-state memories, and optical and magnetic media.

The following examples pertain to further embodiments.

Example 1 is a processing device comprising: 1) compression circuitry to: a) determine a compression configuration to compress source data; b) generate a checksum of the source data in an uncompressed state; c) compress the source data into at least one block based on the compression configuration, wherein the at least one block comprises: a plurality of sub-blocks, wherein the plurality of sub-block includes a predetermined size; a block header corresponding to the plurality of sub-blocks; and 2) decompression circuitry coupled to the compression circuitry, wherein the decompression circuitry to: while not outputting a decompressed data stream of the source data: a) generate index information corresponding to the plurality of sub-blocks; b) in response to generating the index information, generate a checksum of the compressed source data associated with the plurality of sub-blocks; and c) determine whether the checksum of the source data in the uncompressed format matches the checksum of the compressed source data.

In Example 2, the processing device of Example 1, wherein the decompression circuitry is further to: in response to determining that the checksum of the source data in the uncompressed data format matches the checksum of the compressed source data, verify that the source data was properly compressed.

In Example 3, the processing device of Example 1, wherein the decompression circuitry is further to: in response to determining that the checksum of the source data in the uncompressed data format does not match the checksum of the compressed source data, verify that the source data was not properly compressed.

In Example 4, the processing device of Example 1, wherein the decompression circuitry is further to: determine whether source data is compressed into the at least one block based on the compression configuration.

In Example 5, the processing device of Example 1, wherein the block is a Deflate block.

In Example 6, the processing device of Example 1, wherein the index information comprises bit offset of each of the plurality of sub-blocks.

In Example 7, the processing device of Example 1, wherein the decompression circuitry is further to: generate a cumulative checksum of the compressed source data at a bit offset of each of the plurality of sub-blocks.

In Example 8, the processing device of Example 1, wherein a sub-block of the plurality of sub-blocks comprises history information for decompressing all of the data in the sub-block, the history information not including information for other sub-blocks of the plurality of sub-blocks.

In Example 9, the processing device of Example 1, wherein the decompression circuitry is further to: provide for random access of a single sub-block of the plurality of sub-blocks by receiving a request for the single sub-block and decompressing the requested single sub-block while not decompressing other sub-blocks of the plurality of sub-blocks.

Various implementations may have different combinations of the structural features described above. For instance, all optional features of the processors and methods described above may also be implemented with respect to a system described herein and specifics in the examples may be used anywhere in one or more implementations.

Example 10 is a processing system comprising: 1) a core, 2) memory coupled to the core, 3) compression circuitry to: a) determine a compression configuration to compress source data; b) generate a checksum of the source data in an uncompressed state; c) compress the source data into at least one block based on the compression configuration, wherein the at least one block comprises: a plurality of sub-blocks, wherein the plurality of sub-block includes a predetermined size; a block header corresponding to the plurality of sub-blocks; and 4) decompression circuitry coupled to the compression circuitry, wherein the decompression circuitry to: while not outputting a decompressed data stream of the source data: a) generate index information corresponding to the plurality of sub-blocks; b) in response to generating the index information, generate a checksum of the compressed source data associated with the plurality of sub-blocks; and c) determine whether the checksum of the source data in the uncompressed format matches the checksum of the compressed source data.

In Example 11, the processing system of Example 10, wherein the decompression circuitry is further to: in response to determining that the checksum of the source data in the uncompressed data format matches the checksum of the compressed source data, verify that the source data was properly compressed.

In Example 12, the processing system of Example 10, wherein the decompression circuitry is further to: in response to determining that the checksum of the source data in the uncompressed data format does not match the checksum of the compressed source data, verify that the source data was not properly compressed.

In Example 13, the processing system of Example 10, wherein the decompression circuitry is further to: determine whether source data is compressed into the at least one block based on the compression configuration.

In Example 14, the processing system of Example 10, wherein the block is a Deflate block.

In Example 15, the processing system of Example 10, wherein the index information comprises bit offset of each of the plurality of sub-blocks.

In Example 16, the processing system of Example 10, wherein the decompression circuitry is further to: generate a cumulative checksum of the compressed source data at a bit offset of each of the plurality of sub-blocks.

In Example 17, the processing system of Example 10, wherein a sub-block of the plurality of sub-blocks comprises history information for decompressing all of the data in the sub-block, the history information not including information for other sub-blocks of the plurality of sub-blocks.

In Example 18, the processing system of Example 10, wherein the decompression circuitry is further to: provide for random access of a single sub-block of the plurality of sub-blocks by receiving a request for the single sub-block and decompressing the requested single sub-block while not decompressing other sub-blocks of the plurality of sub-blocks.

Various implementations may have different combinations of the structural features described above. For instance, all optional features of the processors and methods described above may also be implemented with respect to a system described herein and specifics in the examples may be used anywhere in one or more implementations.

In Example 19, is a non-transitory computer-readable medium storing instructions, which when executed by a processor, cause the processor to execute a plurality of logic operations comprising: determine a compression configuration to compress source data; generate a checksum of the source data in an uncompressed state; compress the source data into at least one block based on the compression configuration, wherein the at least one block comprises: a plurality of sub-blocks, wherein the plurality of sub-block includes a predetermined size; and a block header corresponding to the plurality of sub-blocks; and while not outputting a decompressed data stream of the source data: generate index information corresponding to the plurality of sub-blocks; in response to generating the index information, generate a checksum of the compressed source data associated with the plurality of sub-blocks; and determine whether the checksum of the source data in the uncompressed format matches the checksum of the compressed source data.

In Example 20, the non-transitory computer-readable medium of Example 19, in response to determining that the checksum of the source data in the uncompressed data format matches the checksum of the compressed source data, verifying that the source data was properly compressed.

In Example 21, the non-transitory computer-readable medium of Example 19, determining whether source data is compressed into the at least one block based on the compression configuration.

In Example 22, the non-transitory computer-readable medium of Example 19, generating a cumulative checksum of the compressed source data at a bit offset of each of the plurality of sub-blocks.

In Example 23, the non-transitory computer-readable medium of Example 19, providing for random access of a single sub-block of the plurality of sub-blocks by receiving a request for the single sub-block and decompressing the requested single sub-block while not decompressing other sub-blocks of the plurality of sub-blocks.

Various implementations may have different combinations of the structural features described above. For instance, all optional features of the processors and methods described above may also be implemented with respect to a system described herein and specifics in the examples may be used anywhere in one or more implementations.

Example 24 is an apparatus comprising 1) means for determining a compression configuration to compress source data; generate a checksum of the source data in an uncompressed state; 2) means for compressing the source data into at least one block based on the compression configuration; and while not outputting a decompressed data stream of the source data: 3) means for generating index information corresponding to the plurality of sub-blocks; in response to generating the index information, 4) means for generating a checksum of the compressed source data associated with the plurality of sub-blocks; and 5) means for determining whether the checksum of the source data in the uncompressed format matches the checksum of the compressed source data.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' capable of/to,' and/or 'operable to,' in one embodiment, refers to some apparatus, logic, hardware, and/or element designed in such a way to enable use of the apparatus, logic, hardware, and/or element in a specified manner. Note as above that use of 'to,' capable of/to,' and/or 'operable to,' in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 910 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A processing device comprising:
   compression circuitry to:
   determine a compression configuration to compress source data;
   generate a checksum of the source data in an uncompressed state; and
   compress the source data into at least one block based on the compression configuration to generate compressed source data, wherein the at least one block comprises:
      a plurality of sub-blocks, wherein each sub-block of the plurality of sub-blocks is to include a corresponding predetermined amount of data; and a block header corresponding to the plurality of sub-blocks; and decompression circuitry coupled to the compression circuitry, wherein the decompression circuitry is to:
while not outputting a decompressed data stream of the source data:
generate index information corresponding to the plurality of sub-blocks;
in response to generating the index information, generate a checksum of the compressed source data associated with the plurality of sub-blocks; and
determine whether the checksum of the source data in the uncompressed state matches the checksum of the compressed source data.

2. The processing device of claim 1, wherein the decompression circuitry is further to:
in response to determining that the checksum of the source data in the uncompressed state matches the checksum of the compressed source data, verify that the source data was properly compressed.

3. The processing device of claim 1, wherein the decompression circuitry is further to:
in response to determining that the checksum of the source data in the uncompressed state does not match the checksum of the compressed source data, verify that the source data was not properly compressed.

4. The processing device of claim 1, wherein the decompression circuitry is further to:
determine whether the source data was compressed into the at least one block based on the compression configuration.

5. The processing device of claim 1, wherein the at least one block is a Deflate block.

6. The processing device of claim 1, wherein the index information comprises bit offset of each of the plurality of sub-blocks.

7. The processing device of claim 1, wherein the decompression circuitry is further to:
generate a cumulative checksum of the compressed source data at a bit offset of each of the plurality of sub-blocks.

8. The processing device of claim 1, wherein a sub-block of the plurality of sub-blocks comprises history information for decompressing all data in the sub-block, the history information not including information for other sub-blocks of the plurality of sub-blocks.

9. The processing device of claim 1, wherein the decompression circuitry is further to:
provide for random access of a single sub-block of the plurality of sub-blocks by receiving a request for the single sub-block and decompressing the requested single sub-block while not decompressing other sub-blocks of the plurality of sub-blocks.

10. A processing system comprising:
a core;
memory coupled to the core;
compression circuitry coupled to the core and the memory, the compression circuitry to:
determine a compression configuration to compress source data;
generate a checksum of the source data in an uncompressed state; and
compress the source data into at least one block based on the compression configuration to generate compressed source data, wherein the at least one block comprises:
a plurality of sub-blocks, wherein each sub-block of the plurality of sub-blocks is to include a corresponding predetermined amount of data; and
a block header corresponding to the plurality of sub-blocks; and decompression circuitry coupled to the compression circuitry, the core and the memory, wherein the decompression circuitry is to:
while not outputting a decompressed data stream of the source data:
generate index information corresponding to the plurality of sub-blocks;
in response to generating the index information, generate a checksum of the compressed source data associated with the plurality of sub-blocks; and
determine whether the checksum of the source data in the uncompressed state matches the checksum of the compressed source data.

11. The processing system of claim 10, wherein the decompression circuitry is further to:
in response to determining that the checksum of the source data in the uncompressed state matches the checksum of the compressed source data, verify that the source data was properly compressed.

12. The processing system of claim 10, wherein the decompression circuitry is further to:
in response to determining that the checksum of the source data in the uncompressed state does not match the checksum of the compressed source data, verify that the source data was not properly compressed.

13. The processing system of claim 10, wherein the decompression circuitry is further to:
determine whether the source data was compressed into the at least one block based on the compression configuration.

14. The processing system of claim 10, wherein the at least one block is a Deflate block.

15. The processing system of claim 10, wherein the index information comprises bit offset of each of the plurality of sub-blocks.

16. The processing system of claim 10, wherein the decompression circuitry is further to:
generate a cumulative checksum of the compressed source data at a bit offset of each of the plurality of sub-blocks.

17. The processing system of claim 10, wherein a sub-block of the plurality of sub-blocks comprises history information for decompressing all data in the sub-block, the history information not including information for other sub-blocks of the plurality of sub-blocks.

18. The processing system of claim 10, wherein the decompression circuitry is further to:
provide for random access of a single sub-block of the plurality of sub-blocks by receiving a request for the single sub-block and decompressing the requested single sub-block while not decompressing other sub-blocks of the plurality of sub-blocks.

19. A method comprising:
determining a compression configuration to compress source data;
generating a checksum of the source data in an uncompressed state;
compressing the source data into at least one block based on the compression configuration to generate compressed source data, wherein the at least one block comprises:

a plurality of sub-blocks, wherein each sub-block of the plurality of sub-blocks is to include a corresponding predetermined amount of data; and a block header corresponding to the plurality of sub-blocks; and while not outputting a decompressed data stream of the source data:

generating index information corresponding to the plurality of sub-blocks;

in response to generating the index information, generating a checksum of the compressed source data associated with the plurality of sub-blocks; and determining whether the checksum of the source data in the uncompressed state matches the checksum of the compressed source data.

20. The method of claim 19, further comprising:

in response to determining that the checksum of the source data in the uncompressed state matches the checksum of the compressed source data, verifying that the source data was properly compressed.

21. The method of claim 19, further comprising:

determining whether the source data was compressed into the at least one block based on the compression configuration.

22. The method of claim 19, further comprising:

generating a cumulative checksum of the compressed source data at a bit offset of each of the plurality of sub-blocks.

23. The method of claim 19, further comprising:

providing for random access of a single sub-block of the plurality of sub-blocks by receiving a request for the single sub-block and decompressing the requested single sub-block while not decompressing other sub-blocks of the plurality of sub-blocks.

* * * * *